United States Patent
Landau et al.

(10) Patent No.: US 9,147,649 B2
(45) Date of Patent: Sep. 29, 2015

(54) MULTI-CHIP MODULE

(75) Inventors: Stefan Landau, Wehrheim (DE); Joachim Mahler, Regensburg (DE); Thomas Wowra, Regensburg (DE)

(73) Assignee: Infineon Technologies AG, Neubiberg (DE)

( * ) Notice: Subject to any disclaimer, the term of this patent is extended or adjusted under 35 U.S.C. 154(b) by 886 days.

(21) Appl. No.: 12/019,282

(22) Filed: Jan. 24, 2008

(65) Prior Publication Data
US 2009/0189291 A1 Jul. 30, 2009

(51) Int. Cl.
| | |
|---|---|
| *H01L 23/48* | (2006.01) |
| *H01L 23/495* | (2006.01) |
| *H01L 25/07* | (2006.01) |
| *H01L 25/16* | (2006.01) |
| *H01L 25/18* | (2006.01) |
| *H01L 23/31* | (2006.01) |
| *H01L 23/538* | (2006.01) |
| *H01L 23/00* | (2006.01) |

(52) U.S. Cl.
CPC .... *H01L 23/49575* (2013.01); *H01L 23/49537* (2013.01); *H01L 23/49562* (2013.01); *H01L 24/25* (2013.01); *H01L 24/83* (2013.01); *H01L 24/97* (2013.01); *H01L 25/074* (2013.01); *H01L 25/165* (2013.01); *H01L 25/18* (2013.01); *H01L 23/3107* (2013.01); *H01L 23/5389* (2013.01); *H01L 24/06* (2013.01); *H01L 24/29* (2013.01); *H01L 24/32* (2013.01); *H01L 2224/18* (2013.01); *H01L 2224/2919* (2013.01); *H01L 2224/32145* (2013.01); *H01L 2224/838* (2013.01); *H01L 2225/06562* (2013.01); *H01L 2924/014* (2013.01); *H01L 2924/01005* (2013.01); *H01L 2924/01013* (2013.01); *H01L 2924/01029* (2013.01); *H01L 2924/01033* (2013.01); *H01L 2924/01068* (2013.01); *H01L 2924/01079* (2013.01); *H01L 2924/01082* (2013.01); *H01L 2924/0665* (2013.01); *H01L 2924/12032* (2013.01); *H01L 2924/12044* (2013.01); *H01L 2924/1305* (2013.01); *H01L 2924/13055* (2013.01); *H01L 2924/14* (2013.01)

(58) Field of Classification Search
USPC .......................... 257/777, E33.066; 438/111
See application file for complete search history.

(56) References Cited

U.S. PATENT DOCUMENTS

| | | | |
|---|---|---|---|
| 5,218,231 A | * | 6/1993 | Kudo ............................. 257/735 |
| 5,403,784 A | | 4/1995 | Hashemi et al. |
| 5,543,658 A | | 8/1996 | Hosokawa et al. |
| 5,790,378 A | | 8/1998 | Chillara |
| 7,138,673 B2 | | 11/2006 | Tanaka |
| 7,569,920 B2 | | 8/2009 | Otremba et al. |

(Continued)

FOREIGN PATENT DOCUMENTS

DE 10301091 A1 7/2004

*Primary Examiner* — Matthew Gordon
(74) *Attorney, Agent, or Firm* — Dicke, Billig & Czaja, PLLC

(57) ABSTRACT

A multi-chip module and method is disclosed. One embodiment provides an electronic module having a first metal structure and a second metal structure. A first semiconductor chip is electrically connected with its back side to the first metal structure. A second semiconductor chip is arranged with its back side lying over the front side of the first semiconductor chip. The second metal structure includes multiple external contact elements attached over the front side of the second semiconductor chip. At least two of the multiple external contact elements are electrically connected to the front side of the second semiconductor chip.

15 Claims, 9 Drawing Sheets

(56) References Cited

U.S. PATENT DOCUMENTS

| | | |
|---|---|---|
| 2001/0015488 A1 | 8/2001 | Akram et al. |
| 2002/0000647 A1 | 1/2002 | Chen et al. |
| 2004/0262773 A1 | 12/2004 | Joh et al. |
| 2005/0212101 A1* | 9/2005 | Funato et al. .............. 257/666 |
| 2006/0118938 A1 | 6/2006 | Tandy |
| 2006/0145319 A1 | 7/2006 | Sun et al. |
| 2006/0175689 A1 | 8/2006 | Shim et al. |
| 2007/0108575 A1* | 5/2007 | Montgomery .............. 257/678 |
| 2007/0164409 A1* | 7/2007 | Holland .............. 257/678 |
| 2008/0048342 A1* | 2/2008 | Cheah et al. .............. 257/777 |
| 2008/0224300 A1 | 9/2008 | Otremba |
| 2008/0272484 A1* | 11/2008 | Myers et al. .............. 257/714 |

\* cited by examiner

MULTI-CHIP MODULE

BACKGROUND

This invention relates to electronic modules and more particularly to electronic modules having a first and a second semiconductor chip.

Electronic modules including at least two semiconductor chips may be arranged in a vast variety of configurations. Some of those include at least one metal structure such as e.g., a leadframe on which the semiconductor chips are arranged and electrically contacted.

For these and other reasons, there is a need for the present invention.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

DETAILED DESCRIPTION

Figure 1:
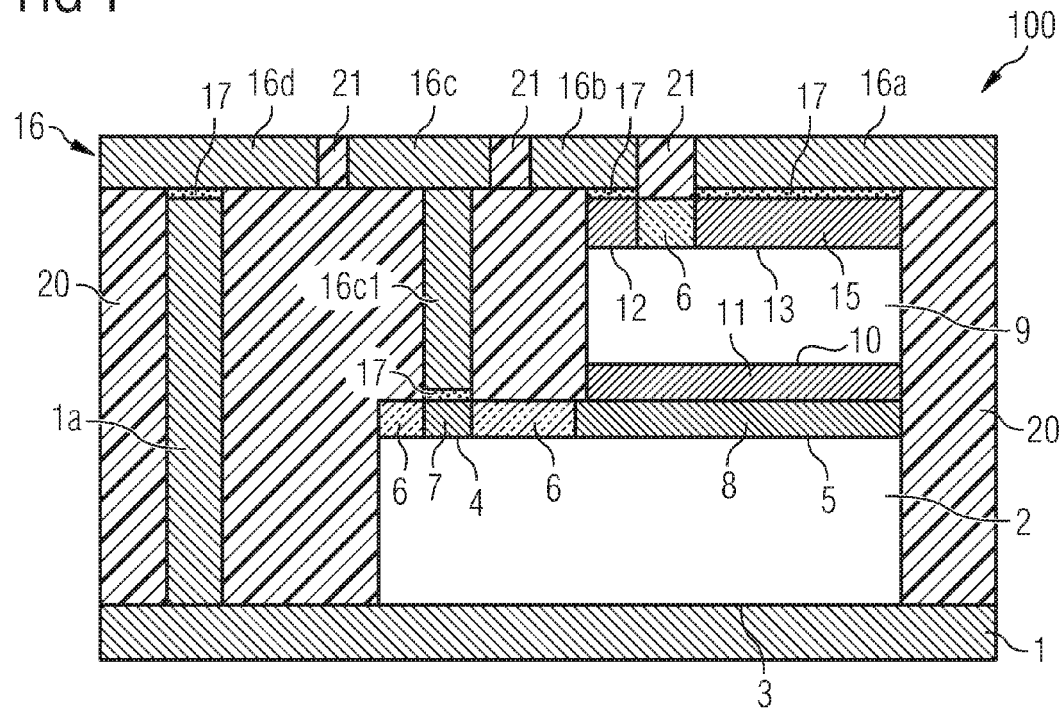
FIG. 1 is a schematic cross-sectional view of an electronic module having two power semiconductor chips according to a first exemplary embodiment.

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various exemplary embodiments described herein may be combined with each other, unless specifically noted otherwise.

Modules with semiconductor chips and fabrication methods thereof are described below. The semiconductor chips may be of extremely different types and may include for example integrated electrical or electro-optical circuits. The semiconductor chips may, for example, be configured as power transistors, power diodes, IGBTs (Insulated Gate Bipolar Transistor), control circuits, microprocessors or micro-electromechanical components. In one embodiment, semiconductor chips having a vertical structure may be involved, that is to say that the semiconductor chips may be fabricated in such a way that electric currents can flow in a direction perpendicular to the main surfaces of the semiconductor chips. A semiconductor chip having a vertical structure may have contact elements in one embodiment on its two main surfaces, that is to say on its top side and bottom side. In one embodiment, IGBTs, power transistors and power diodes may have a vertical structure. By way of example, the source terminal and gate terminal of a power transistor and the anode terminal of a power diode may be situated on one main surface, while the drain terminal of the power transistor and the cathode terminal of the power diode are arranged on the other main surface. A power diode may be embodied as a Schottky diode. Furthermore, the modules described below may include integrated circuits to control the integrated circuits of other semiconductor chips, for example, the integrated circuits of power transistors or power diodes. The semiconductor chips need not be manufactured from specific semiconductor material and, furthermore, may contain inorganic and/or organic materials that are not semiconductors, such as for example insulators, plastics or metals. Moreover, the semiconductor chips may be packaged or unpackaged.

The semiconductor chips may be placed on carriers such as e.g., metal plates. The carriers may be of various shape, size or material. The carriers may be made of a leadframes or may be part of a leadframe. The carriers may be shaped by various techniques such as stamping, bending, etching etc. During the fabrication of the modules the carriers may be connected to each other. The carriers may be connected amongst each other by connectors or connection mechanisms or methods with the purpose of separating the carriers in the course of the fabrication. Separation of the carriers may be carried out by mechanical sawing, a laser beam, cutting, stamping, milling or any other appropriate method. They may be fabricated from metals or metal alloys, in one embodiment copper, copper alloys, aluminum, aluminum alloys, or other appropriate materials.

At least two semiconductor chips are arranged at different levels in the electronic module. In this context, the terms "arranged over" or "arranged above" or similar terms referring to the location of an upper semiconductor chip in relation to a lower semiconductor chip do not necessarily mean that the upper semiconductor chip is located within the circumferential extension of the lower semiconductor chip or intersects this circumferential extension. Such terms merely refer to the level of altitude of the semiconductor chips.

A mold material such as a dielectric material, e.g., a polymer or silicon, may be used to embed the semiconductor chips and the carriers or to fill the space between the carriers which then may remain uncovered at their outer sides. In one embodiment, it is possible that no mold material is applied, i.e. that the module remains completely unsealed by mold material.

FIG. 1 illustrates an electronic module 100 according to a first exemplary embodiment. The module includes a first metal plate 1 which may extend across most of or the full lateral dimensions of the module 100. A first semiconductor chip 2 is mounted with its back side on the metal plate 1. In FIG. 1, by way of example, the first semiconductor chip 2 is a vertical power device and may include a power transistor. The back side of the first semiconductor chip 2 contains the drain contact 3 of the power transistor. The drain contact 3 of the power transistor is electrically connected to the first metal plate 1 by electrically conductive adhesion mechanisms or methods (not illustrated) such as soldering, welding, gluing etc.

The front side of the first semiconductor chip 2 carries the gate contact 4 and the source contact 5 of the power transistor. A gate metallization 7 and a source metallization 8 are provided to connect to the gate contact 4 and the source contact 5 of the power transistor, respectively. A dielectric material 6 is arranged between the gate metallization 7 and the source metallization 8 to serve as an electric insulation.

A second semiconductor chip 9 is mounted with its back side on the source metallization 8 of the first semiconductor chip 2. By way of example, the second semiconductor chip 9 may also be a vertical power device and may also include a power transistor. In this case, the drain contact 10 of the second semiconductor chip 9 may be electrically connected to the source metallization 8 of the first semiconductor chip 2 via a drain metallization 11 of the second semiconductor chip 9. The connection between the metallizations 8, 11 may be made directly by electrically conductive adhesion mechanisms or methods (not illustrated) such as soldering, welding, gluing etc.

The second semiconductor chip 9 further includes a gate contact 12 and a source contact 13 at the upper surface thereof. The gate contact 12 and the source contact 13 are covered by a gate metallization 14 and a source metallization 15, respectively. A dielectric material 6 is arranged between the gate metallization 14 and the source metallization 15 to serve as an electric insulation.

The metallizations 7, 8, 11, 14, 15 of the semiconductor chips 2, 9 are chip contact pads which allow electrical contact to be made with the semiconductor chips 2, 9. The metallizations 7, 8, 11, 14, 15 may be composed of any desired electrically conductive material, for example of a metal, such as copper, aluminum or gold, a metal alloy or an electrically conductive organic material. Generally, the metallizations 7, 8, 11, 14, 15 may be situated on the active surfaces of the semiconductor chips or on other surfaces of the semiconductor chips. In case of power semiconductor chips 2, 9 as illustrated in FIG. 1, the metallizations 7, 8, 11, 14, 15 may be situated on both sides of the power semiconductor chips 2, 9 and may include drain, source and gate terminals.

The module 100 further includes a second metal plate 16 which is arranged above the second semiconductor chip 9. The second metal plate 16 is structured. More specifically, the second metal plate 16 includes a number of separate parts which are intended to provide the external electrical terminals of the module 100. By way of example, the second metal plate 16 may include a first part 16a to provide a source contact terminal of module 100, a second part 16b to provide a first gate contact terminal of module 100, a third part 16c to provide a second gate contact terminal of module 100 and a fourth part 16d to provide a drain contact terminal of module 100. The parts 16a, 16b, 16c and 16d are not in direct electrical contact to each other.

More specifically, the first part 16a of the second metal plate 16 is connected by an electrically conductive adhesion material 17 such as e.g., a conductive glue or solder to the source metallization 15 of the second semiconductor chip 9. The second part 16b of the second metal plate 16 is connected by an electrically conductive adhesion material 17 such as e.g., a conductive glue or solder to the gate metallization 14 of the second semiconductor chip 9. The third part 16c of the second metal plate 16 is designed to have an integral protrusion or strip 16c1 bent down towards the gate metallization 7 of the first semiconductor chip 2. The protrusion 16c1 is connected by an electrically conductive adhesion material 17 such as e.g., a conductive glue or solder to the gate metallization 7 of the first semiconductor chip 2. Further, the first metal plate 1 may be employed with a wall portion 1a extending perpendicular to the first plate 1. The upper end of the wall portion 1a is connected by an electrically conductive adhesion material 17 such as e.g., a conductive glue or solder to the fourth part 16d of the second plate 10. In one embodiment, a bent-down wall portion may be an integral part of the fourth part 16d of the second plate 16 and a lower end thereof may in this case be connected by an electrically conductive adhesion material 17 such as e.g., a conductive glue or solder to the first plate 1.

Thus, the second plate 16 embodies the external terminals of the module 100. In most applications, module 100 may be mounted to a mounting platform such as e.g., a printed circuit board (PCB) by connecting the parts 16a-d of the second plate 16 to corresponding contact pads on the mounting platform (not illustrated). In other words, module 100 may represent a surface mounted device (SMD) with the second plate 16 representing the mounting side of the device.

Further, as it is apparent from FIG. 1, the second plate 16 may include integral interconnect structures such as the bent-down protrusion 16c1 which are used as electrical redistribution elements for contacting e.g., the first semiconductor chip 1. Similar integral interconnect structures may also be formed with the first metal plate 1 (cf. for instance the wall portion 1a). The integral interconnect structures may partly or completely replace any conventional interconnect structures or contacting means such as bond-wires, bond-clips or bond-ribbons which are known to be conventionally used in the art. These integral interconnect structures 1a, 16c1 may be designed by e.g., stamping, etching, sawing or other separation techniques in combination with bending or drawing or other mechanical deformation techniques.

The semiconductor chips 2, 9 may be embedded in a mold material 20. The mold material 20 may fill the space between the first and second metal plates 1, 16 and may fill spacings 21 between the parts 16a-d of the second metal plate 16. However, the mold material 20 preferably does not cover the outer surfaces of the first and second metal plates 1, 16. As the outer surfaces of the metal plates 1, 16a preferably remain completely exposed, these surfaces remain solderable and heat generated in the semiconductor chips 2, 9 may be transferred via both metal plates 1, 16 out of the module 100. To this end, the first and/or the second metal plate 1, 16 may be connected to a heat sink or cooling body, e.g., such as a substrate (e.g., PCB) in view of the second metal plate 16 or a metal heat radiator element in view of the first metal plate 1 to effectively remove the heat from the module 100. In other words, the stacked semiconductor chips 1, 9 are encapsulated in a casing having preferably at least two exposed metal side walls, wherein the metal side walls are established by the first and second metal plates 1, 16 on which the first and second chips 2, 9 are mounted, respectively, and which may further be designed to provide for an module-internal interconnect structure between chip contact and external terminals of the module 100. It is to be noted that the orientation of the second semiconductor chip 9 in relation to the second metal plate 16 may be referred to as a flip-chip arrangement, because the natural way of mounting a vertical power device including a power transistor on a carrier is to connect the carrier to the drain side of the power semiconductor chip rather than to connect the carrier to the source and gate side of the power semiconductor chip as is done here.

Figure 2:
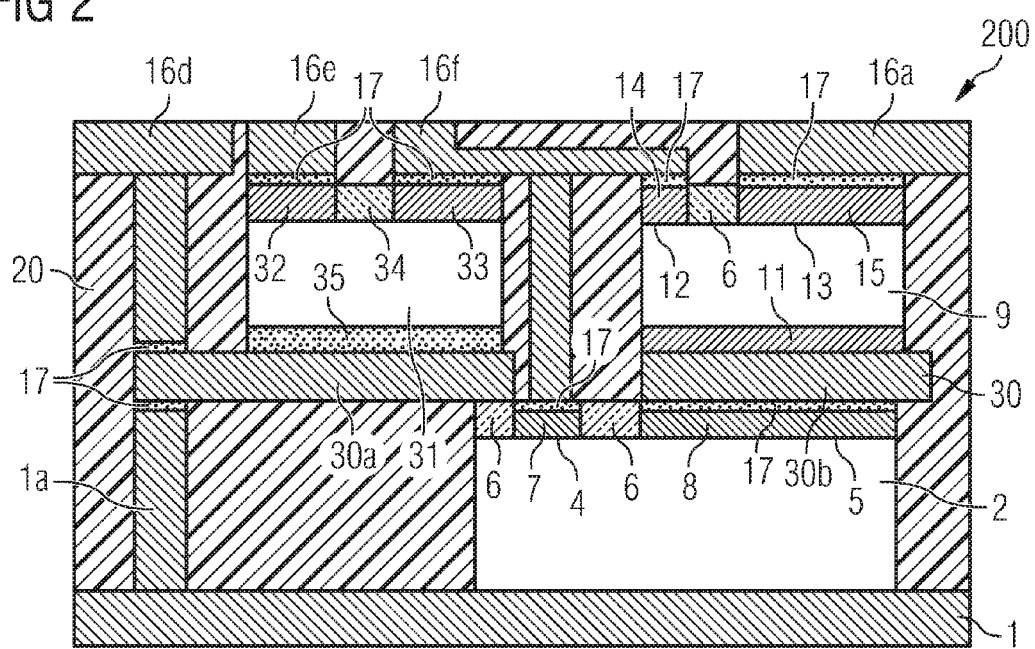
FIG. 2 is a schematic cross-sectional view of an electronic module having two power semiconductor chips according to a second exemplary embodiment.

FIG. 2 illustrates a second module 200 as a second embodiment. The second module 200 is largely similar to the first module 100 such that the description of module 100 in view of the similarities also applies to module 200. Therefore, only those features of module 200 which are different to module 100 are described in more detail in the following.

Module 200 embodies a third semiconductor chip 31 which may be a logic integrated circuit. The third semiconductor chip 31 may have various input/output ports of which two input/output ports are illustrated in FIG. 2 by way of example. The input/output ports of the third semiconductor chip 31 are covered by metallizations 32, 33 which are separated by a dielectric material 34. Here, part 16*e* of the second metal plate 16 is connected by an electrically conductive adhesion material 17 such as e.g., a conductive glue or solder to the input/output metallization 32 of the third semiconductor chip, and part 16*b* of the second metal plate 16 is connected by an electrically conductive adhesion material 17 such as e.g., a conductive glue or solder to the input/output metallization 33 of the third semiconductor chip 31. The parts 16*e* and 16*f* form first and second external input/output terminals IO1 and IO2 of the module 200, respectively. It is to be noted that the second metal plate 16 in FIG. 2 is different in shape compared to the second metal plate 16 in FIG. 1. More specifically, the second part 16*b* in FIG. 2 interconnects all three semiconductor chips 2, 9, 31, that is to say interconnects the gate contact 4 of the first semiconductor chip 2, the gate contact 12 of the second semiconductor chip 9 and a control input of the third semiconductor chip 31. Further, it is illustrated in FIG. 2 that a portion of the second part 16*f* of the second metal plate 16 is recessed and covered by mold material. Such recessed structure could be fabricated by a partial etch process. This technique could be used to shape and locate the external terminals of the module in a desired manner irrespective of an internal interconnect routing or the positions of the semiconductor chips 2, 9, 31.

Further, module 200 includes an intermediate third metal plate 30. As illustrated in FIG. 2, this intermediate third metal plate 30 may also be structured. By way of example, the third semiconductor chip 31 may be mounted by an adhesive material 35 such as e.g., glue on the intermediate third metal plate 30. The third semiconductor chip 31 may be a logic integrated circuit. Particularly in this case, the bottom side of the third semiconductor chip 31 may fail to include any chip contacts. Then, the adhesive material 35 may be made e.g., of an electrically non-conductive glue. In this case, a part 30*a* of the intermediate third metal plate 30 merely serves as a mechanical support for the third semiconductor chip 31. On the other hand, a second part 30*b* of the intermediate third metal plate 30 could be arranged in-between the source metallization 8 of the first semiconductor chip 2 and the drain metallization 11 of the second semiconductor chip 9. Such part 30*b* of the intermediate third metal plate 30 is operable to conduct a high current between the first and second semiconductor chips 2, 9. Similar to the first and second metal plates 1, 16, also the intermediate third metal plate 30 may be designed to have one or more integral portions (not illustrated) which are bent out of the plane of the plate 30 in the upward or downward direction and which may serve as an interconnect structure internal to the module 200. As a result, the third metal plate 30 enhances the internal interconnect capabilities and conventional interconnect techniques such as wire-bonding, clip-bonding or ribbon-bonding may be avoided the same way as in module 100. This building scheme, i.e. to apply an intermediate, structured metal plate which, one the one hand, serves as a carrier (die pad) for a semiconductor chip and, on the other hand, provides for an internal interconnect structure, may be repeated as often as desired.

Figure 3:
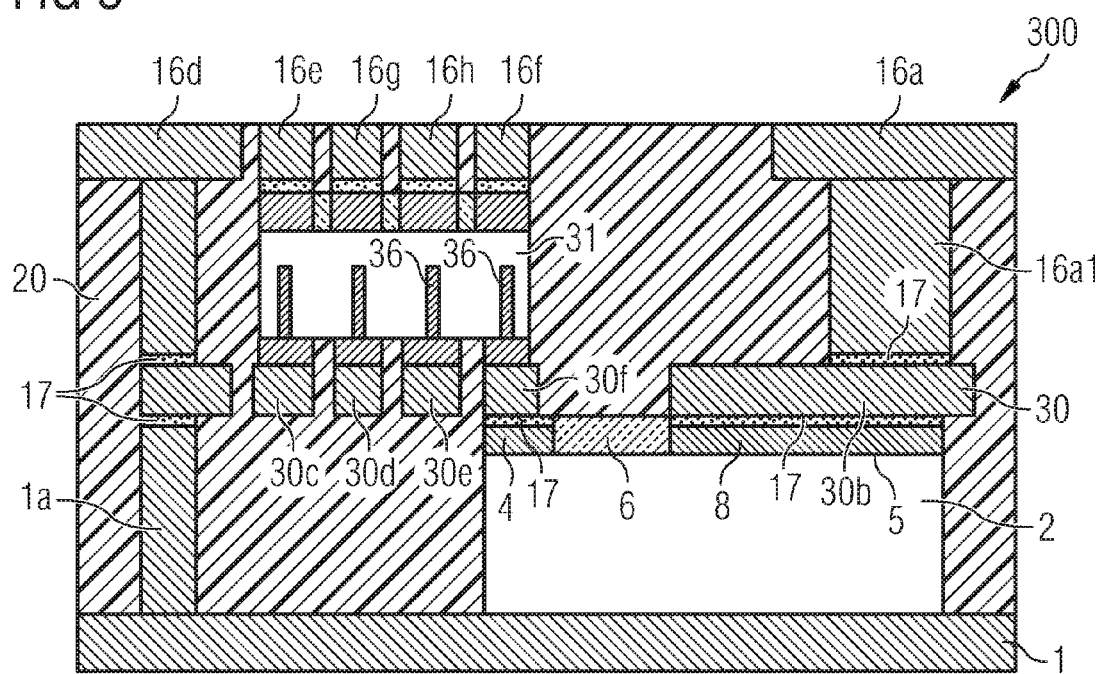
FIG. 3 is a schematic cross-sectional view of an electronic module having two power semiconductor chips according to a third exemplary embodiment.

FIG. 3 illustrates a third module 300 as a third embodiment. Design elements which are similar to module 100 and/or module 200 have been described before and will be omitted in the following description to avoid reiteration. Briefly, module 300 includes a first semiconductor chip 2 (e.g., a vertical power transistor chip as described above) and a logic integrated circuit similar to the third semiconductor chip 31 in FIG. 2. The third semiconductor chip 31 is located over the first semiconductor chip 2 in a laterally displaced relationship with respect to the widthwise extension of the module 300. The second semiconductor chip 2 is omitted. Again, the second metal plate 16 may include a part 16*d* which is connected to the first metal plate 1 and thus to the drain contact of the first semiconductor chip 1, and a source part 16*a* which is connected to a source contact of the first semiconductor chip 2. To this end, the source part 16*a* is equipped with a thick wall structure 16*a*1 which is adapted to conduct high power currents and which is integrally formed with the part 16*a* of the second metal plate 16. In the example illustrated in FIG. 3, four external input/output terminals IO1, IO2, IO3 and IO3 of module 300 are illustrated by way of example. These four input/output terminals IO1, IO2, IO3, IO4 are represented by four parts 16*e*, 16*g*, 16*a*, 16*f* of the second metal plate 16.

In contrast to the second embodiment illustrated in FIG. 2, the logic integrated circuit 31 includes contact holes 36 which open to the bottom side of the third semiconductor chip 31. These contact holes 36 are made to connect an internal chip wiring (not illustrated) to parts 30*c*, 30*d*, 30*e* and 30*f* of the intermediate third metal plate 30. Thus, in this case, the parts 30*c*-*f* of the intermediate third metal plate 30 provide both for an electrical connection and for a mechanical support of the third semiconductor chip 31. Further, it is to be noted that such contact hole design of the third semiconductor chip 31 allows to directly contact the third semiconductor chip 31 via part 30*f* of the third metal plate 30 to the gate contact 4 of the first semiconductor chip 2.

Features specific to one or more of the embodiments illustrated in FIGS. 1 to 3 may be combined in a number of ways not illustrated within the drawings. For example, especially if the module is provided with an intermediate third metal plate 30, an upper semiconductor chip (e.g., second semiconductor chip 9 or third semiconductor chip 31) may be laterally displaced from the lower semiconductor chip, i.e. must not necessarily be located within a region inside or intersecting the outline of the lower semiconductor chip (e.g., semiconductor chip 2), but may be located over the lower semiconductor chip in an area beyond the outline of the lower semiconductor chip in a top view representation. Briefly, no overlap, partly overlap or full overlap designs are possible. Further, it is also possible that none of the at least two semiconductor chips are power devices. For instance, a module may include two or more logic integrated circuits arranged in accordance with the previous description one over the over.

Figure 4:
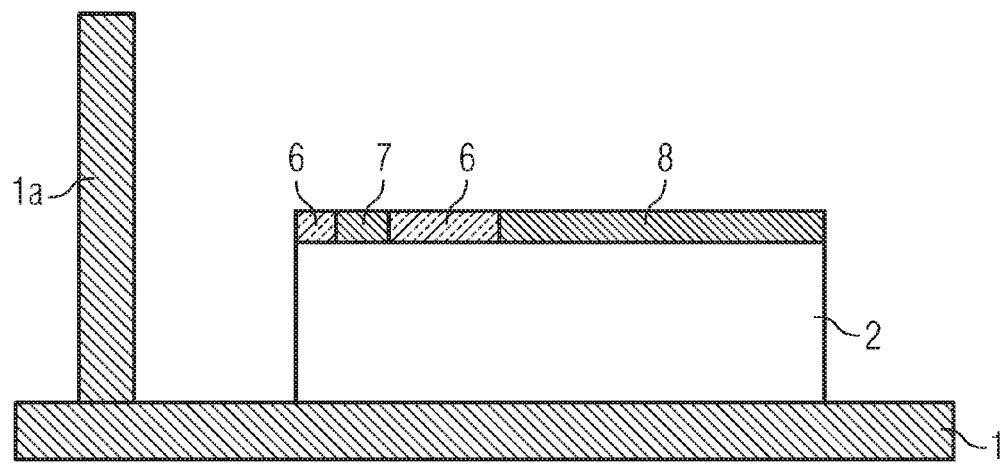
FIGS. 4 to 6 schematically illustrate a method to fabricate the module according to the first exemplary embodiment illustrated in FIG. 1.
Figure 5:
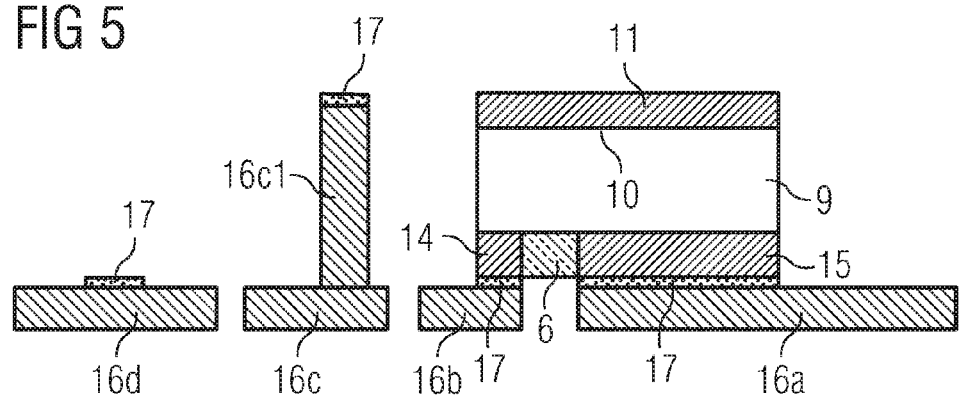
Figure 6:
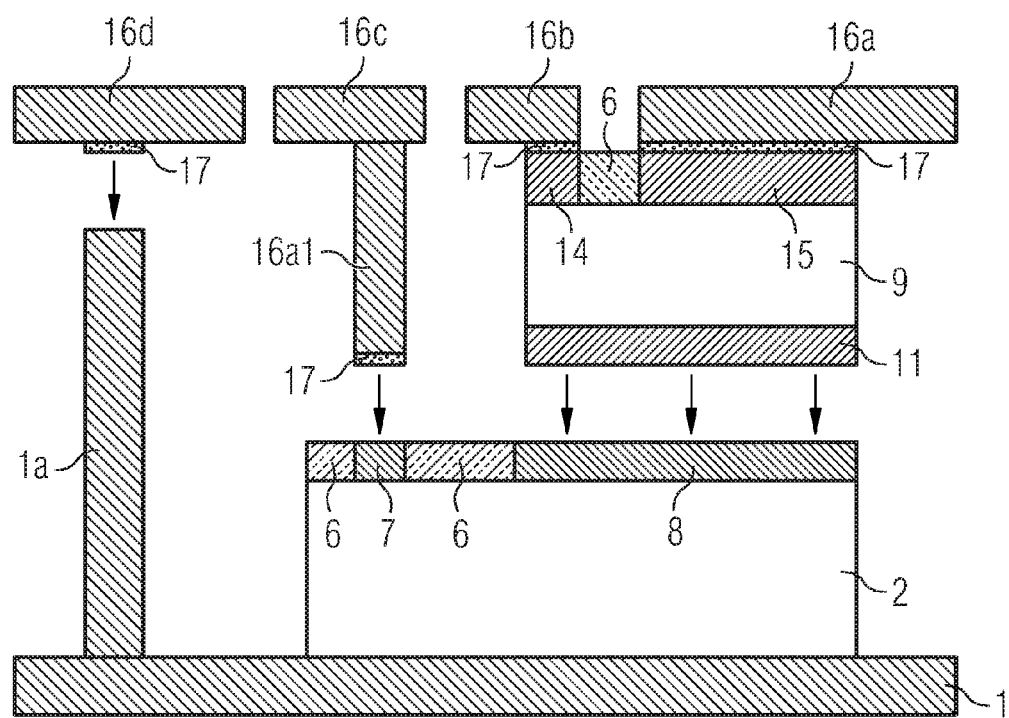

FIGS. 4 to 6 illustrate processes of fabrication of module 100 illustrated in FIG. 1. Initially, the first and second metal plates 1, 16 are prepared by e.g., structuring and/or bending processes. Then, the first (lower) semiconductor chip 2 is mounted on the first metal plate 1, see FIG. 4. Moreover, the second (upper) semiconductor chip 9 is mounted on the second metal plate 16 in chip-flip orientation. In one embodiment, as illustrated in FIG. 6, both assemblies (i.e. the first metal plate 1 carrying the first semiconductor chip 2 and the second metal plate 16 carrying the second semiconductor chip 9) are electrically and mechanically connected together. As already mentioned, the connection of these two assemblies may be made by using solder (solder wire, solder paste or diffusion solder) or electrically conductive glue 17. To this end, a final tempering or curing process is performed in order to create the corresponding connections and to harden the module.

In one embodiment the process illustrated in FIGS. 4 to 6, where two pre-formed assemblies are finally combined to the module 100, module 100 may be manufactured in a step-by-step process beginning e.g., at the bottom side of the module 100 and ending at the top side of the module 100. In this case, initially the first semiconductor chip 2 is mounted on the pre-structured first metal plate 1 as illustrated in FIG. 4. Then, the second semiconductor chip 9 is attached to the source metallization 8 of the first semiconductor chip 2. In one embodiment, the pre-structured second metal plate 16 is connected to the first metal plate 1 at the upper end of the wall portion 1*a*, via protrusion 16*c*1 to the gate metallization 7 of the first semiconductor chip 2 and to the gate and source metallizations 14, 15 of the second semiconductor chip 9. The same adhesion materials 17 and techniques may be used as described above.

Figure 7:
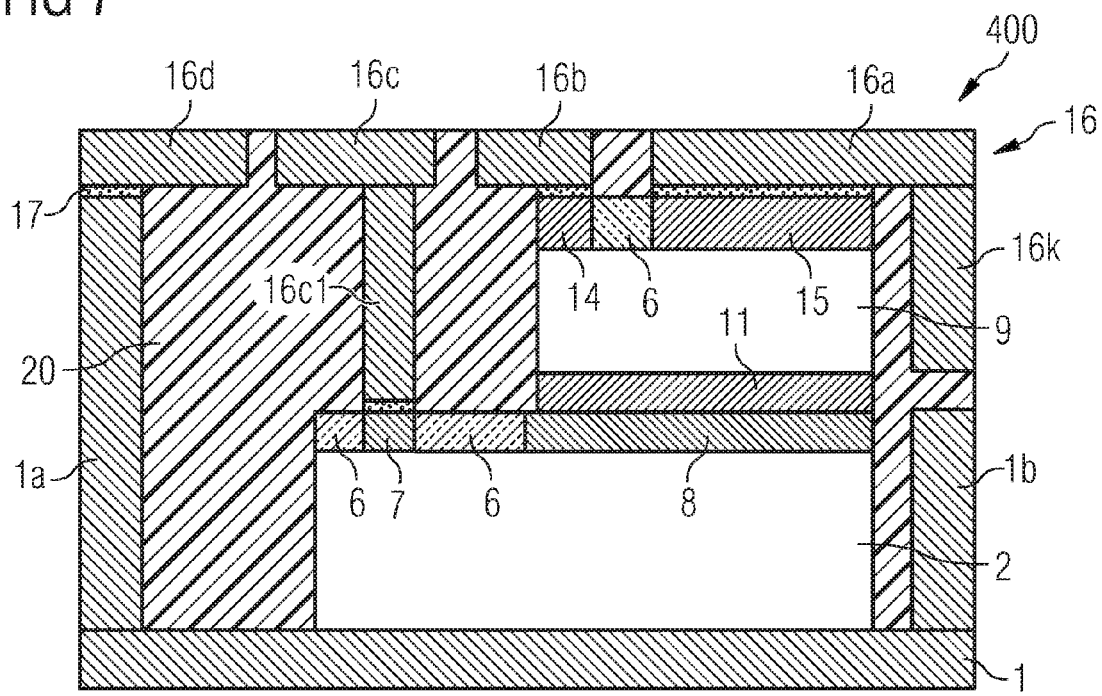
FIG. 7 is a schematic cross-sectional view of an electronic module according to a fourth exemplary embodiment.

FIG. 7 illustrates a module 400 as a fourth exemplary embodiment. Module 400 largely resembles module 100, and therefore reference is made to the description of module 100. As a difference to module 100, the wall portion 1*a* used in module 400 is designed to create an outer side wall or casing of the module 400. At the other side opposite of the wall portion 1*a*, the first metal plate 1 is provided with a side wall portion 1*b* which equally represents an outer side wall or module casing and may cover e.g., a lower half of the module side. The second metal plate 16 may be equipped with a side wall portion 16*k* covering e.g., the upper half of the module side. The side wall portion 1*b* and the side wall portion 16*k* are separated from each other by mold material in order to avoid to short-circuit the drain contact of the first semiconductor chip 2 to the source contact of the second semiconductor chip 9. The outer surfaces of the side wall portions 1*a*, 1*b*, 16*k* are essentially uncovered by mold material 20. The other side walls of module 400 not illustrated in FIG. 7 may equally be made of bent metal portions of the plates 1 and/or 16. That way, also the side wall regions of module 400 may be used to transfer heat out of module 400. This provides for a "full side cooling" facility of module 400.

Figure 8:
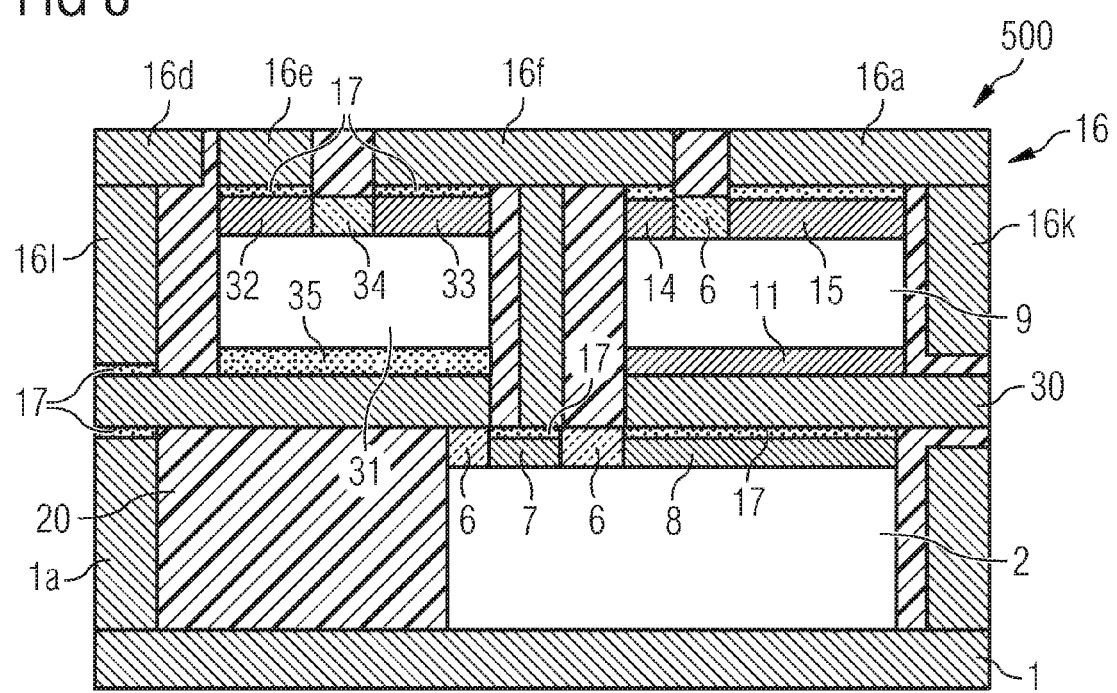
FIG. 8 is a schematic cross-sectional view of an electronic module having two power semiconductor chips and a logic semiconductor chip according to a fifth exemplary embodiment.

FIG. 8 illustrates a module 500 as a fifth exemplary embodiment. Module 500 largely resembles module 200 illustrated in FIG. 2, and reference is made to the corresponding description. However, similar to module 400, a "full side cooling" casing is provided. To this end, side wall portions 1*a*, 1*b* are provided at the first metal plate 1 and side wall portions 16*k* and 16*l* are provided at the second metal plate 16. While side wall portions 1*a* and 16*l* are electrically interconnected via the third metal plate 30, side wall portions 1*b* and 16*k* end up in a spaced apart relationship and are not connected to the third metal plate 30. Again, it is to be noted that the wall portions 1*a*, 1*b*, 16*k* may be formed as integral parts of the first and second metal plates 1, 16, respectively, for instance by using a bending method.

Figure 9:
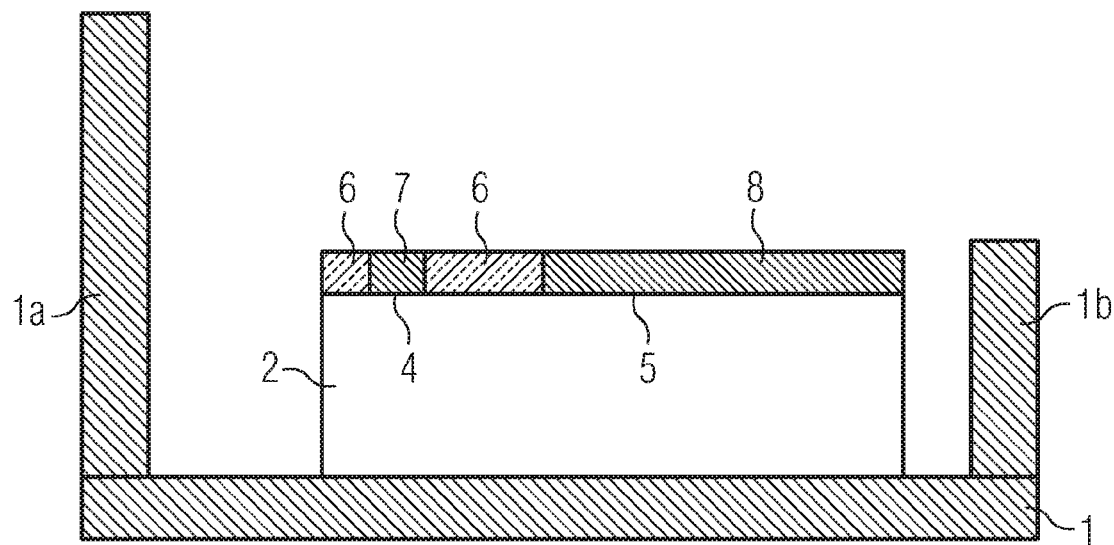
FIG. 9 to 11 schematically illustrate a method to fabricate the module according to the fifth exemplary embodiment illustrated in FIG. 8.
Figure 10:
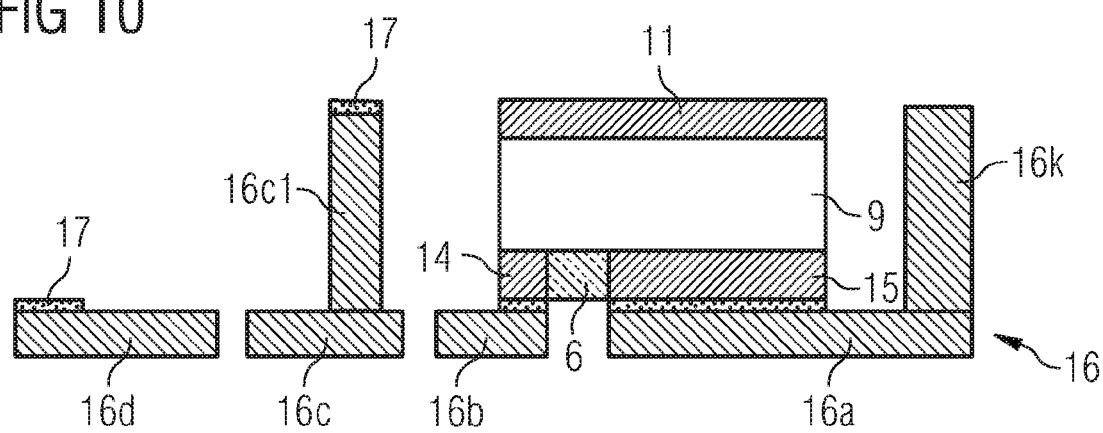
Figure 11:
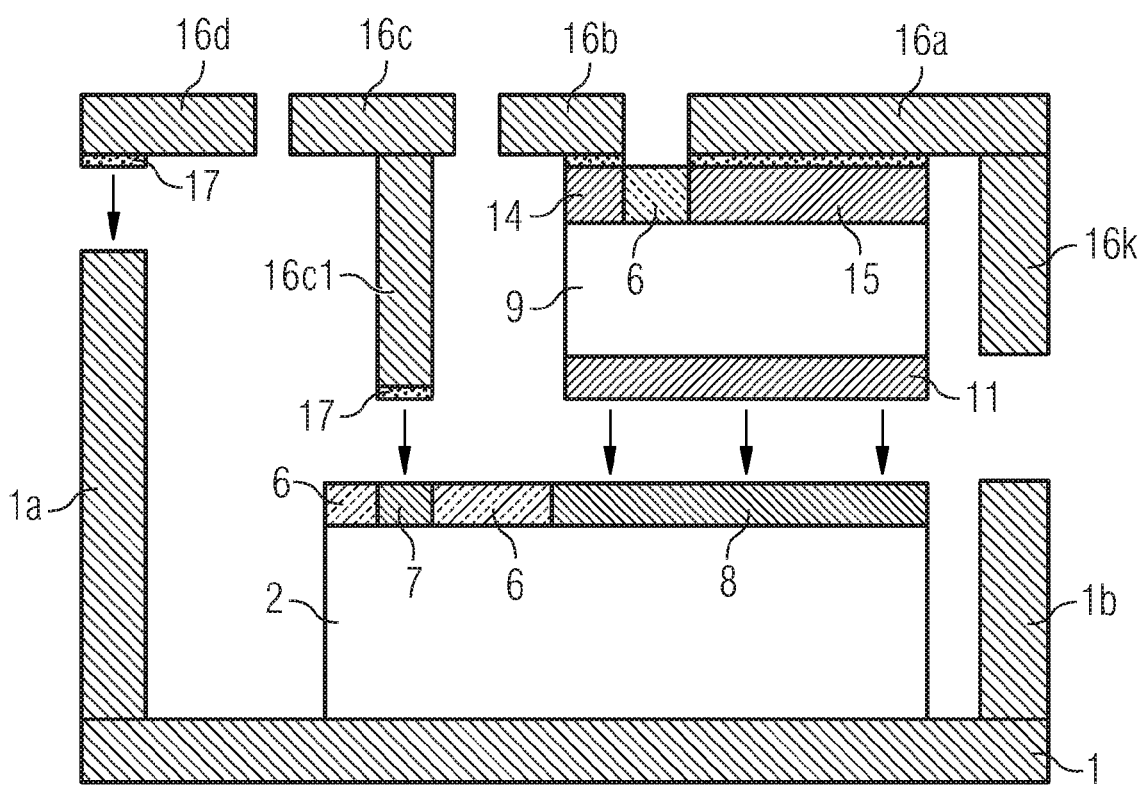

FIGS. 9 to 11 illustrate method processes to fabricate module 400 illustrated in FIG. 7. The processes illustrated in FIGS. 9 to 11 are similar to the processes illustrated in FIGS. 4 to 6 relating to module 100. Thus, analogously, a first assembly including the first metal plate 1 and the first (lower) semiconductor chip 2 is manufactured (FIG. 9). The second (upper) semiconductor chip 9 is fixed to the second metal plate 16 to provide a second assembly illustrated in FIG. 10. In one embodiment, the first and the second assemblies are connected together as illustrated in FIG. 11. To avoid reiteration, reference is made to the description in conjunction with FIGS. 4 to 6 in which the same manufacturing process is described in more detail. In one embodiment, a step-by-step build-up scheme as explained earlier may be applied.

Throughout FIGS. 1 to 11, the first metal plate 1 may be a part of a first integral array of metal plates, the (structured) second metal plate 16 may be a part of a second integral array of metal plates and the intermediate third metal plate 30 may be a part of a third integral array of metal plates. Typically, in such integral arrays of metal plates, all metal plates are held in place by tiny leads which protrude from the metal plates and are fixed to a peripheral frame structure. Usually, all metal plates of each array of metal plates are of similar design. Such arrays of metal plates are referred to as leadframes in the art.

Figure 12:
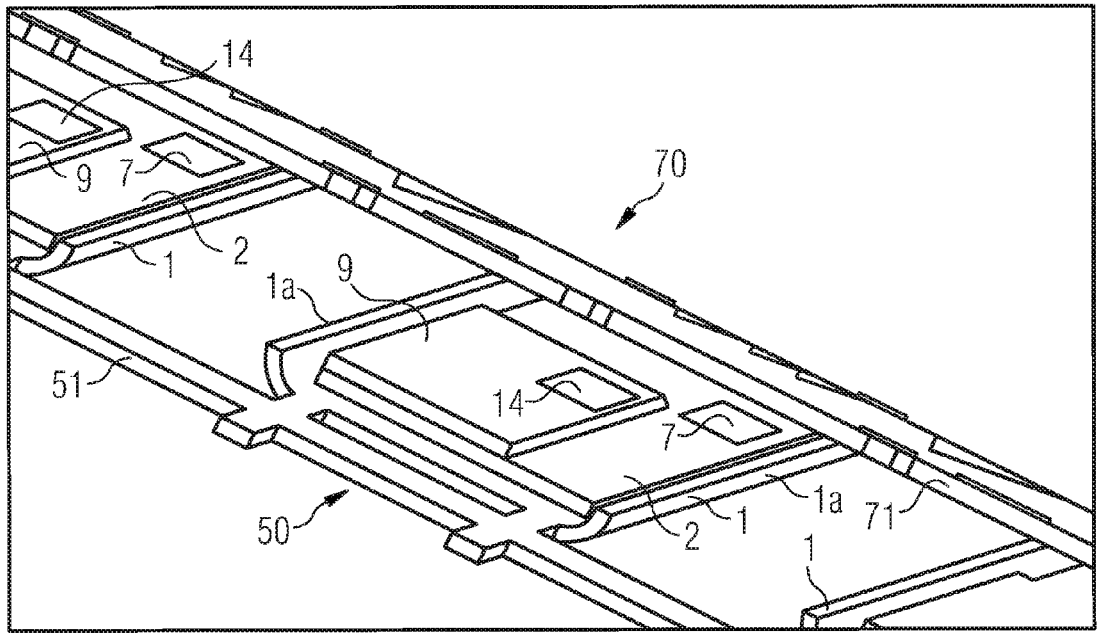
FIG. 12 is a first perspective representation of an array of first and second metal structures enclosing a first and a second semiconductor chip.
Figure 13:
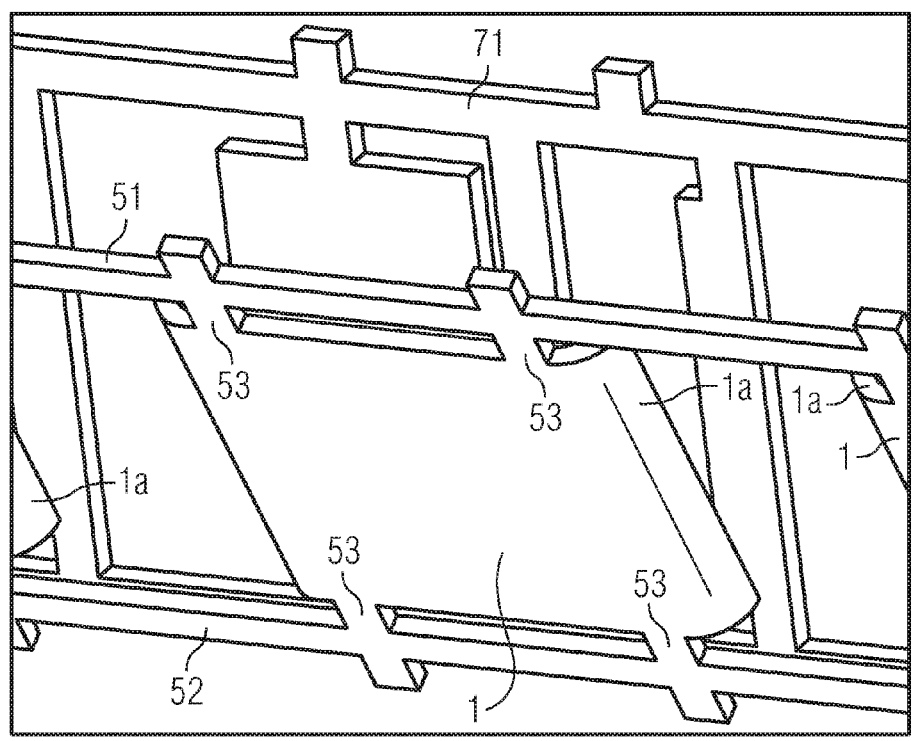
FIG. 13 is a second perspective representation of the array of first and second metal structures of FIG. 12.
Figure 14:
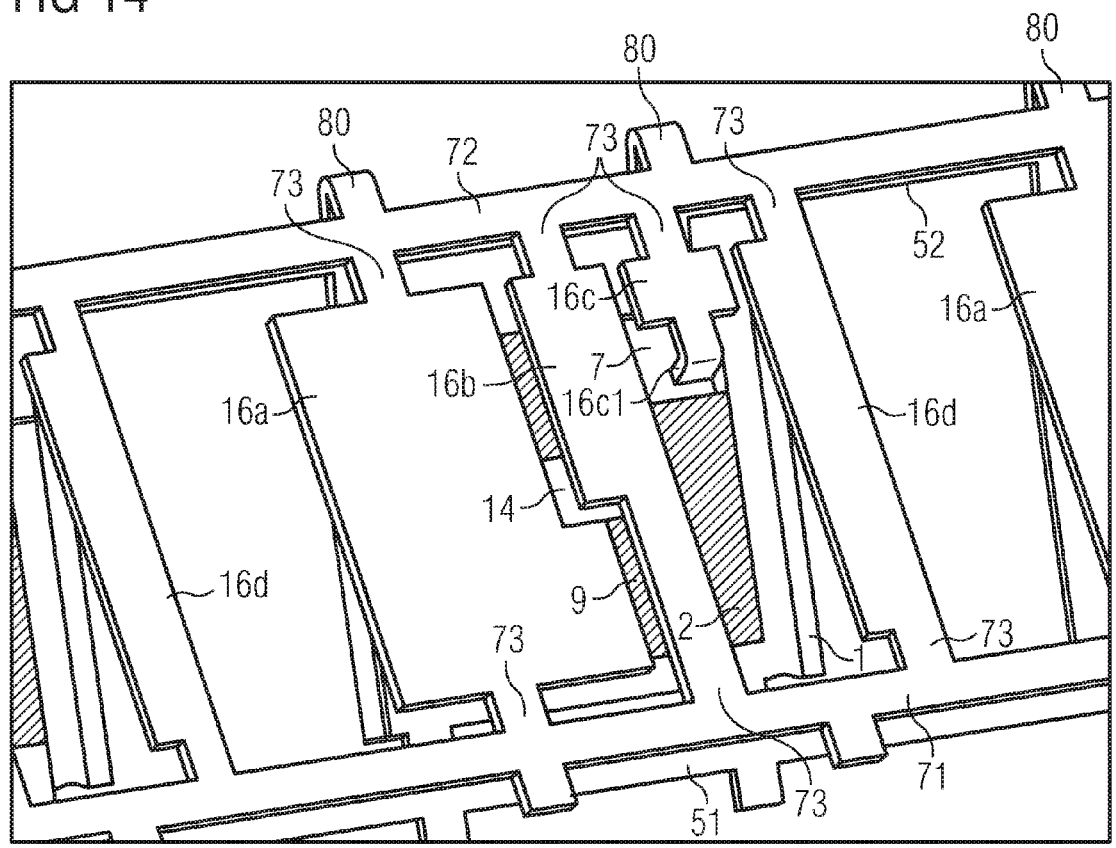
FIG. 14 is a third perspective representation of the array of first and second metal structures of FIG. 12.

FIGS. 12 to 14 illustrate perspective views onto first and second leadframes 50 and 70, which are integrally connected to each other by bending elements 80. FIG. 12 is a side view from a slightly elevated position, FIG. 13 is a bottom view from a position beneath the first, lower leadframe 50 and FIG. 14 is a top view from a position above the second, upper leadframe 70. The first leadframe 70 includes two parallel frame rails 51, 52 to which the first metal plates 1 are connected via leads 53. The metal plates 1 are equipped with bent-up side wall portions 1*a* similar to the side wall portions 1*a* illustrated in FIGS. 7 to 11. As may be best seen from FIG. 12, the first (lower) semiconductor chip 2 is already mounted on the first metal plate 1 and the second (upper) semiconductor chip 9 is already mounted on the first semiconductor chip 2. The first and second leadframes 50, 70 are illustrated in an open configuration, i.e. the second (upper) leadframe 70 has not yet been bent down to connect to the side wall portions 1*a* of the first metal plates 1 of the lower leadframe 50 and to the gate metallizations 7, 14.

The pre-structured layout of the plates 16 of the second leadframe 70 is best illustrated in FIG. 14. First part 16*a*, second part 16*b* and fourth part 16*d* are suspended from the frame rails 71 and 72 by leads 73. The third part 16*c* of the structured second metal plate 16 is connected to only the frame rail 72 via lead 73. The first part 16*a*, the second part 16*b* and the fourth part 16*d* extend along nearly the full distance between the frame rails 71 and 72 (that is to say across the full side length of the module to be generated), whereas the third part 16*c* is designed to be smaller in length. The design of the second plate 16 as illustrated in FIG. 14 may be used e.g., for modules 100 and 400 as illustrated in FIGS. 1 and 7, respectively.

FIGS. 12 to 14 relate to a manufacturing process in which the modules are built-up from the bottom to the top. At the end of the process, the second leadframe 70 is folded downward and the electrical connections are established as described before. Then, mold material may be applied to the double leadframe structure. As mentioned before, the mold material is inhibited to cover most or the entire area of the outer metal surfaces of the first and second metal plates 1, 16. This may also be achieved by removing mold material from the outer metal surfaces of the first and second metal plates 1, 16 after the molding step. After encapsulation of the first and second semiconductor chips 2, 9 by mold material such as e.g., epoxy resin, single modules are separated from the frame rails 51, 52 and 71, 72 by removing leads 53 and leads 73, respectively. This may be carried out by laser sawing, stamping, breaking or other processes. It is possible to remove the leads 53 and 73 after establishing the electrical connections but in advance of the molding step.

Figure 15:
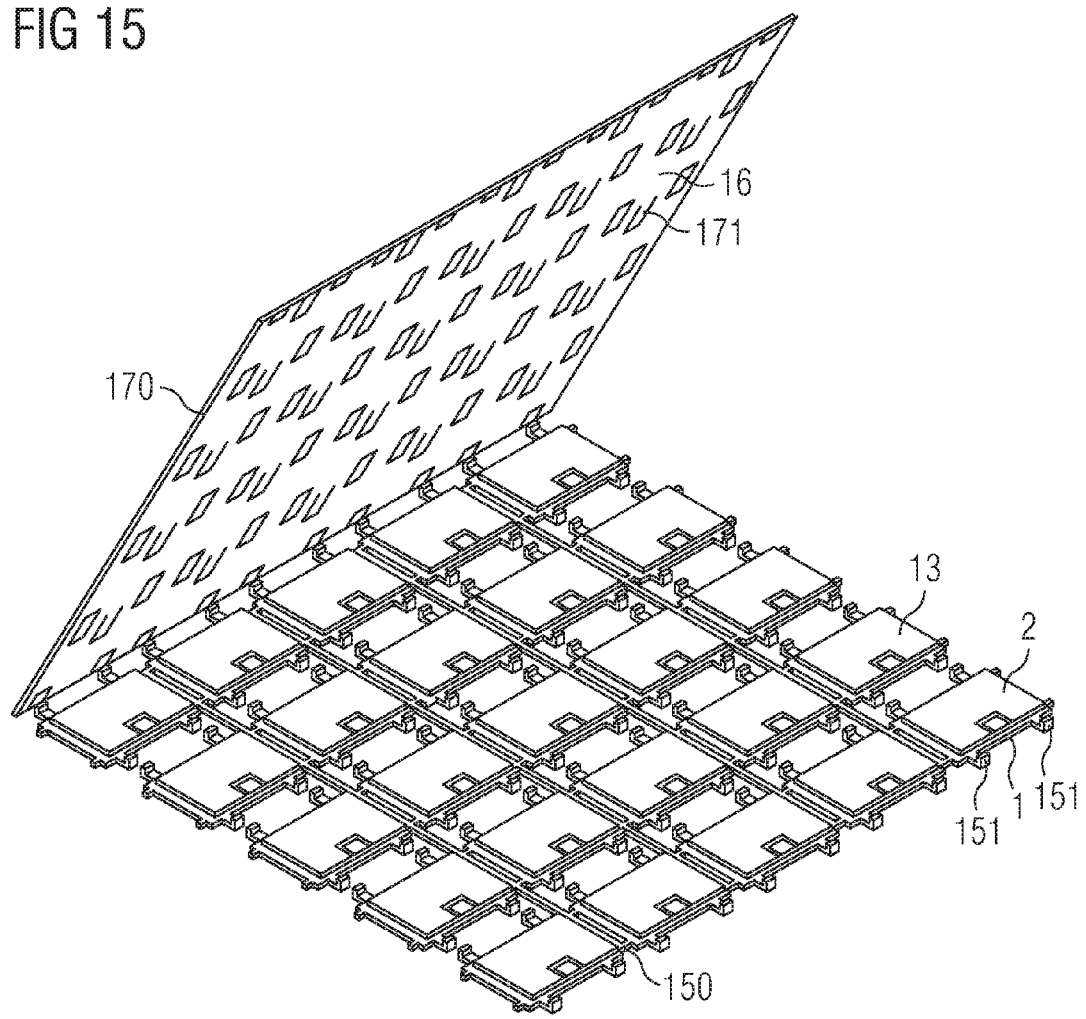
FIG. 15 is a perspective view of a matrix array of first and second metal structures enclosing a first and a second semiconductor chip.

Leadframes 50 and 70 may also be designed as a two-dimensional matrix array. FIG. 15 is a simplified representation of a first integral matrix array 150 including first metal plates 1 and a second integral matrix array 170 including structured second metal plates 16. The first matrix array 150 is designed to correspond to a plurality of first arrays 50 as illustrated in FIGS. 12 to 14 arranged side-by-side. Equally, the second matrix array 170 is designed to correspond to a plurality of second arrays 70 as illustrated in FIGS. 12 to 14 arranged a side-by-side. The structuring of the second matrix array 170 is indicated in a simplified representation by reference sign 171 rather than illustrated in full detail.

FIG. 15 illustrates the first semiconductor chips 2 mounted on the first metal plates 1. Then, the second semiconductor chips 9 (not illustrated) are either attached either to the second metal plates 16 or mounted onto the first semiconductor chips 2. Both approaches have been described above in detail. Then, the integral matrix array 170 of second metal plates 16, i.e. leadframe 170, is placed over the integral matrix array 150 of first metal plates 1, i.e. leadframe 150. Both, the integral matrix array of first metal plates 1 and the integral matrix array 170 of second metal plates 16 may have members that allow correct alignment of the metal plates 1, 16. For example, these members may function according to the lock-and-key principle so that a member of one of the metal plates engages a member of the other metal plate in order to align the first and second metal plates 1 and 16. By way of example, the first metal plates 1 may be equipped with hook members 151. After alignment, the electrical connections are established. As described before, a common, single tempering or curing process may allow to simultaneously create all electrical connections. In one embodiment, before or after separating the array structure into single modules, mold material 20 may be applied to protect the interior of the electronic modules. Again, it is to be noted that no conventional bonding method such as e.g., wire-bonding, ribbon-bonding or clip-bonding has to be applied. In other words, as the entire bonding and interconnect structure is integral to the leadframes 150, 170, no separate parts (such as bond-wires, bond-ribbons or bond-clips) are needed.

All modules disclosed above may use die pads (i.e. first metal plates 1) of small size and may achieve a high level of integration. Further, no split first metal plate 1 is necessary even though multi-chip modules are obtained. A high degree of design variability may be achieved. Further, the two-sided metal casing provides for an improved cooling capability which may further be enhanced by side wall cooling if metal side walls are provided. Such metal side walls further serve to mechanically protect the module.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. An electronic module comprising:
a first metal plate having a first major surface and a second major surface and having at least one integral bent-up interconnect portion extending generally perpendicular from the second major surface of the first metal plate;
a first semiconductor chip including a front side and a back side, the front side including a first contact and a second contact, the backside electrically connected to and mounted on the second major surface of the first metal plate;
a second semiconductor chip including a front side and a back side, the front side including at least two contacts, the back side of the second semiconductor chip including a contact arranged over the front side of the first semiconductor chip and electrically connected to the second contact on the front side of the first semiconductor chip; and
a second metal plate having a first major surface and a second major surface attached over the front side of the second semiconductor chip with the second major surface facing the second semiconductor chip, the second metal plate being structured to form multiple external contact elements, wherein at least two of the multiple external contact elements are electrically connected to the at least two contacts on the front side of the second semiconductor chip, wherein at least one of the multiple external contact elements includes an integral bent-down interconnect portion that extends perpendicularly from the second major surface of the second metal plate to the first contact on the front side of the first semiconductor chip and is electrically connected thereto, wherein the multiple external contact elements are not in direct electrical contact with each other, and wherein each of the multiple external contact elements separately provides an external electrical terminal, wherein the second metal plate is physically discontinuous from the at least two contacts on the front side of the second semiconductor chip, and wherein at least two contacts on the front side of the second semiconductor chip are electrically connected to the multiple external contact elements of the second metal plate by an electrically conductive adhesion material;
wherein the at least one of the integral bent-up interconnect portion of the first metal plate extends to and is directly connected to one of the multiple external contact elements of the second metal plate, and the integral bent-up interconnect portion is uncovered by mold material; and
a molded body embedding the first and second semiconductor chips, wherein the first major surfaces of the first and second metal plates, including the multiple external contact elements, are exposed by the molded body, and wherein the contact on the back side of the second semiconductor chip and second contact on the front side of the first semiconductor, and the electrical connection there between, are embedded within the molded body and are not directly connected to an external contact element.

2. The electronic module of claim 1, comprising wherein the integral bent-up interconnect portion of the first metal plate is electrically connected to the second metal plate by adhesion means.

3. The electronic module of claim 1, further comprising:
a third metal plate arranged between the first semiconductor chip and the second semiconductor chip.

4. The electronic module of claim 3, comprising wherein the second metal plate is electrically connected to the third metal plate by adhesion means.

5. The electronic module of claim 1, comprising wherein the first and/or the second metal plate is structured by stamping, etching and/or sawing.

6. The electronic module of claim 1, comprising wherein the first metal plate is part of a first leadframe.

7. The electronic module of claim 1, comprising wherein the second metal plate is part of a second leadframe.

8. The electronic module of claim 1, comprising wherein the first and/or the second semiconductor chip comprises a power transistor.

9. A method of manufacturing an electronic module, comprising:
providing a first metal plate;
attaching a first semiconductor chip over the first metal plate such that a back side of the first semiconductor chip is electrically connected to the first metal plate;
providing a second metal plate including multiple external contact elements;
attaching the second metal plate over a second semiconductor chip such that at least two electrodes on a front side of the second semiconductor chip are electrically connected to at least two of the multiple external contact elements of the second metal plate; and
attaching the second semiconductor chip over the first semiconductor chip such that the back side of the second semiconductor chip is electrically connected to the front side of the first semiconductor chip and at least one of the multiple external contact elements extends to an electrode on the front side of the first semiconductor chip, wherein the at least one of the multiple external contact elements includes a planar portion situated parallel to the first metal plate and an integral bent-down interconnect protrusion extending perpendicular to the planar portion, the bent-down interconnect protrusion extending to and directly connected to an electrode on the first side of the first semiconductor chip;
wherein the multiple external contact elements are not in direct electrical contact with each other, and wherein each of the multiple external contact elements separately provides an external electrical terminal;
wherein the second metal plate is physically discontinuous from the at least two electrodes on the front side of the second semiconductor chip, and wherein at least two electrodes on the front side of the second semiconductor chip are electrically connected to the multiple external contact elements of the second metal plate by an electrically conductive adhesion material; and
embedding the first and second semiconductor chips in a molded body of the electronic module, wherein outer surfaces of the first metal plate and of the multiple external contact elements of the second metal plate are exposed by the molded body, wherein the electrical connection between the back side of the second semiconductor chip and the front side of the first semiconductor chip is not directly connected to an external contact element.

10. The method of claim 9, comprising performing attaching the second semiconductor chip over the first semiconductor chip by soldering or welding or gluing.

11. The method of claim 9, wherein the first and second metal plates are integrally attached to one another by bending elements, wherein attaching the first and second semiconductor chips to the first and second metal plates is accomplished prior to the step of attaching the second semiconductor chip over the first semiconductor chip, and wherein the method further comprises:
folding the second metal plate over the first metal plate.

12. An electronic module comprising:
a first semiconductor chip having a front side and a back side;
a second semiconductor chip having a front side and a back side, the second semiconductor chip stacked on the first semiconductor chip with an electrode on the backside of the second semiconductor chip disposed on and electrically connected to a first electrode on the front side of the first semiconductor chip; and
wherein the first and second semiconductor chips are disposed between a first metal plate and a second metal plate, wherein the backside of the first semiconductor chip is disposed on and electrically connected to the first metal plate, and wherein the second metal plate is electrically connected to the first metal plate, to a second electrode on the front side of the first semiconductor chip, and to electrodes on the front side of the second semiconductor chip, and wherein the electrode on the back side of the second semiconductor chip and the first electrode on the front side of the first semiconductor chip are not directly connected to the first and second metal plates.

13. The electronic module of claim 12, wherein the second metal plate is physically discontinuous from the electrodes on the first and second semiconductor chips and from the first metal plate, and wherein the second metal plate is electrically connected to the second electrode on the front side of the first semiconductor chip, to the electrodes on the front side of the second semiconductor chip, and to the first metal plate with electrically conductive adhesion material.

14. The electronic module of claim 12, wherein a contact on the back side of the first semiconductor chip is disposed on and electrically connected to a major surface of the first metal plate, wherein the second metal plate includes a major surface facing the major surface of the first metal plate, and wherein the second metal plate is structured to define multiple external contacts with at least one external contact electrically connected to the first metal plate, at least one external contact electrically connected to the second electrode on the front side of the first semiconductor chip, and at least two external contacts electrically connected to corresponding ones of the electrodes on the front side of the second semiconductor chip.

15. The electronic module of claim 12, wherein one of the multiple external contacts of the second metal plate includes an integral bent-down interconnect portion extending perpendicularly from the major surface and is electrically connected to the electrode on the front side of the first semiconductor chip, and wherein in the first metal plate includes an integral bent-up interconnect portion extending perpendicularly from the major surface and is electrically connected to one of the multiple external contacts of the second metal plate.

* * * * *